United States Patent [19]

Kane et al.

[11] 3,914,515

[45] Oct. 21, 1975

[54] PROCESS FOR FORMING TRANSITION METAL OXIDE FILMS ON A SUBSTRATE AND PHOTOMASKS THEREFROM

[75] Inventors: James Kane, Affolter am Albis; Hanspeter Schweizer, Zurich, both of Switzerland

[73] Assignee: RCA Corporation, New York, N.Y.

[22] Filed: July 16, 1973

[21] Appl. No.: 379,552

[52] U.S. Cl. ................ 428/432; 427/166; 427/273; 427/252; 427/314; 427/255

[51] Int. Cl.$^2$ ........................ B32B 17/06; C23C 11/08; C03C 17/22; B29B 11/00

[58] Field of Search............. 117/211, 107.1, 106 A, 117/107.2 R, 5.5, 8, 221, 123 B, 106 R, 123 C; 106/1; 204/192; 260/429 L, 439 CY

[56] References Cited

UNITED STATES PATENTS

| | | | |
|---|---|---|---|
| 2,887,406 | 5/1959 | Homer | 117/107.2 R |
| 3,031,338 | 4/1962 | Bourdeau | 117/107.2 R |
| 3,121,729 | 2/1964 | Fischer et al. | 117/107.2 R |
| 3,138,625 | 6/1964 | Cais | 117/107.2 R |
| 3,159,660 | 12/1964 | Closson et al. | 117/107.2 R |
| 3,681,227 | 8/1972 | Szupillo | 117/211 |
| 3,711,322 | 1/1973 | Kushihashi | 117/33.3 |
| 3,758,326 | 9/1973 | Hennings et al. | 117/106 A |
| 3,793,068 | 2/1974 | Pammer | 117/107.2 R |

FOREIGN PATENTS OR APPLICATIONS

| | | | |
|---|---|---|---|
| 684,892 | 4/1964 | Canada | 117/107.2 R |
| 597,939 | 5/1960 | Canada | 117/107.2 R |

*Primary Examiner*—Douglas J. Drummond
*Assistant Examiner*—J. J. Gallagher
*Attorney, Agent, or Firm*—Glenn H. Bruestle; Birgit E. Morris

[57] ABSTRACT

Photomasks for microcircuit technology are prepared by evaporating cyclopentadienyl derivatives of transition metals, contacting the vapor with a heated substrate in an oxygen-containing atmosphere to form transition metal oxide films on the substrate and removing part of the film to form a desired pattern.

5 Claims, 2 Drawing Figures

PROCESS FOR FORMING TRANSITION METAL OXIDE FILMS ON A SUBSTRATE AND PHOTOMASKS THEREFROM

This invention relates to a process for depositing semi-transparent films of transition metal oxides on a substrate. More particularly, this invention relates to a process for depositing uniform, semi-transparent films of transition metal oxides on a substrate by chemical vapor deposition, for use as photomasks.

BACKGROUND OF THE INVENTION

Photomasks are comprised of thin patterned films of a masking material on a transparent substrate. They are used in microcircuit technology to process localized areas so as to form complex patterns. They are made by applying thin films of a masking material to a transparent substrate, coating the film with a photoresist, exposing the photoresist to a light pattern, developing the photoresist to expose portions of the masking material and etching the exposed portions away. The remaining photoresist is then removed, leaving the masking material in the form of a pattern on the transparent substrate.

In the manufacture of microcircuit devices, the photomasks are contacted to a photoresist coated wafer, illuminated with UV light which passes through the transparent areas of the mask to impinge upon the photoresist layer according to the pattern of the photomask. Generally, a plurality of photomasks are employed consecutively in the manufacture of microcircuit devices having complex patterns. Thus it is important that the pattern definition or resolution of the photomask be as high as possible to ensure adequate quality in the completed device. Also, good alignment of succeeding photomasks on the wafer is required. In consequence, the photomask materials should be readily etchable with a solvent which is compatable with conventional photoresist formulations to form well defined patterns, such as hydrochloric acid, and should be at least partly transparent to visible light for proper alignment.

Photomasks were first made using photographic emulsions on glass to form the patterns, but these masks were readily scratched and damaged by repeated use.

Chromium films on glass have also been employed, but they are not satisfactory because they are opaque, which makes alignment of the mask difficult, and because they are reflective, which creates fringing of light and loss of resolution in the pattern imparted to the photoresist coated wafer.

More recently, transition metal oxide films have been employed. These films, particularly iron oxides having a thickness of about 500–5,000A, are advantageous in that they are semi-transparent to visible light, allowing for correct alignment of the photomask, and absorbing at the UV wavelengths used to expose the photoresist layer to be processed.

Semi-transparent transition metal oxide films have been formed heretofore in several ways. Preparation of films by radio frequency sputtering of an iron target have been disclosed in U.S. Pat. No. 3,669,863 and 3,681,227. However, such films are difficultly etchable and lengthy sputtering times are required.

MacChesney et al., *J. Electrochem. Soc.* 118, 776 (1971), have disclosed chemical vapor deposition of organic carbonyl compounds, such as iron pentacarbonyl, in oxygen. The resultant films, while they had good transparency and absorption characteristics, were not readily etchable at room temperature and provide less than satisfactory resolution. Further, iron pentacarbonyl is extremely toxic and dangerous to work with. Thus improved methods of preparing transition metal oxide films which have uniform thickness, are readily etchable to form high definition patterns, and are both semi-transparent to visible light and absorbing at UV light wavelengths, which can be employed in the fabrication of improved photomasks are still being sought.

SUMMARY OF THE INVENTION

It has been discovered that thin, uniform, semitransparent films of transition metal oxides can be deposited on a substrate in a simple, rapid process by vaporizing certain volatile transition metal organometallic compounds and exposing the vapor to a heated substrate in the presence of oxygen.

DETAILED DESCRIPTION OF THE INVENTION

The present process comprises vaporizing a cyclopentadiene derivative of a transition metal at low temperatures, heating a substrate at elevated temperatures, and contacting the heated substrate with the vapor of the transition metal compound in an oxygen containing atmosphere.

The volatile transition metal cyclopentadiene compounds useful in the process have the formula $(C_5H_5)_xM$ wherein M is one or more transition metals and $x$ is an integer corresponding to the valence of the transition metal. These compounds have the general structure

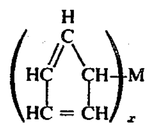

wherein M and $x$ are as defined above. As employed herein, the term transition metal includes the first transition group of metals of increasing atomic number from titanium to nickel, i.e., titanium, vanadium, chromium, manganese, iron, cobalt, nickel and copper. Iron and nickel are preferred.

The transition metal cyclopentadiene compounds are well known and are available commercially. They can be prepared in known manner by reaction of an anhydrous transition metal chloride and a solution of sodium cyclopentadienide in tetrahydrofuran, in a polyether such as ethylene glycol dimethyl ether or in an amine such as pyridine. A detailed description of a suitable preparation is given by Wilkinson et al, *J. Inorg. and Nucl. Chem.* 2, 95 (1956)

Figure 1:
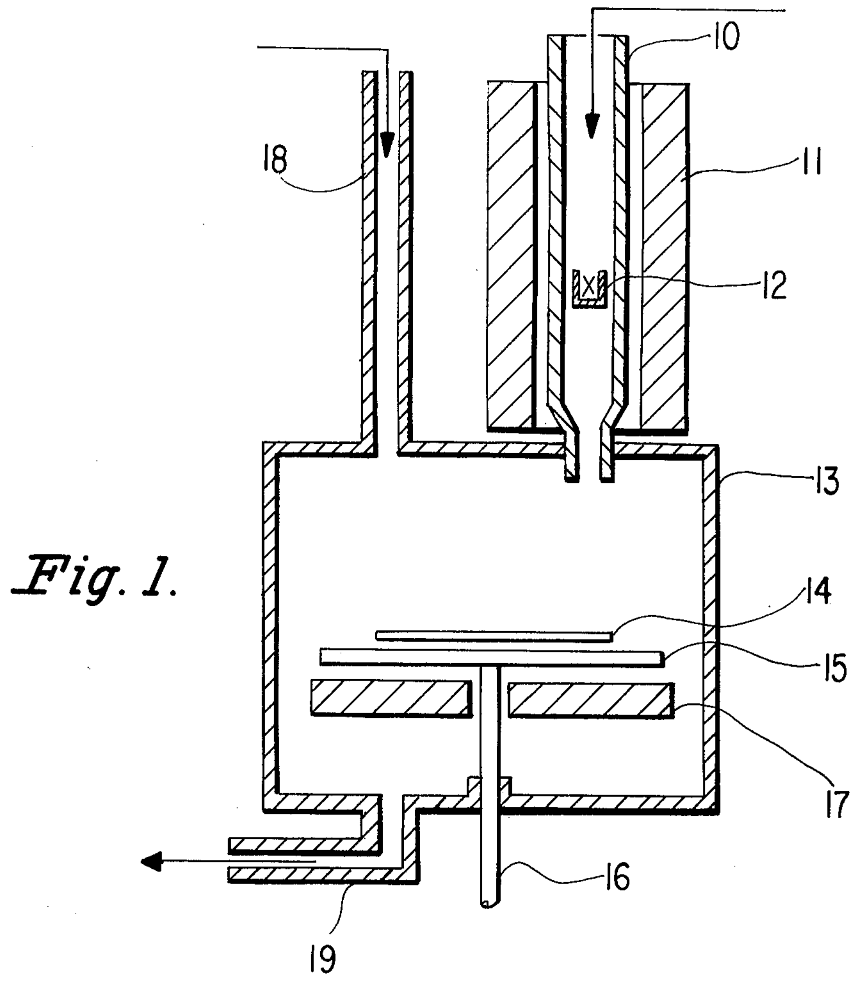
FIG. 1 is a sectional elevational view of an apparatus useful in the practice of the method described herein.

An apparatus suitable for preparing the films described herein is shown in FIG. 1. A carrier gas is introduced into an inlet tube 10 which is encased in a furnace 11 and wherein is situated a container 12 for the organometallic compound. The carrier gas and the organometallic compound are heated to a temperature between about 100° and 140°C., preferably about 110°–120°C., which volatilizes the organometallic compound and forms a reactant gas stream. The reactant gas stream passes to a sealed reaction chamber 13 containing a substrate 14 to be coated. The substrate 14 rests on a rotatable platform 15 turned by a motor driven shaft 16. The platform 15 is heated by a heating platform 17 that heats the substrate to the desired temperature. An oxygen containing gas is pumped into the reaction chamber 13 via an inlet tube 18 to maintain an oxygen containing atmosphere in the reaction chamber 13. This gas can be oxygen or oxygen diluted with an inert gas, such as nitrogen. The spent gases exit from the reaction chamber 13 through an outlet tube 19 which is cooled to condense any unreacted organometallic compound for collection and recycle.

It will be readily apparent that a plurality of substrates can be coated per cycle by proper choice of the size of the rotatable platform and arrangement of substrates.

The carrier gas can be any inert gas, such as neon, argon, krypton, nitrogen and the like. In the case where the organometallic compound will not react with oxygen at the volatilization temperature, the carrier gas can be oxygen or an inert gas admixed with oxygen, in which case a separate oxygen containing gas stream will not be required.

The time required for the reaction will vary depending on the thickness of the metal oxide film desired, the temperature of the substrate and the concentration of the reactant gas stream and the oxygen-containing gas stream. In general, satisfactory thin films up to about 1 micron in thickness can be grown at a rate of about 100 Angstroms (hereinafter A) per minute. Thus films about 2,000A thick can be deposited in about 20–30 minutes. Films from 500 to 5,000A thick are suitable; however, films from about 1,700–2,500A thick are generally preferred for use as photomasks.

Substrates suitable for use in the invention will be heat resistance at the temperatures of deposition and include glass, quartz, garnet, alumina, magnesium oxide, sapphire, silicon and the like. When fabricating photomasks, transparent substrates or glass or quartz may be employed.

The substrate is heated to the deposition temperature which can be from about 300°–550°C. In general, temperatures of about 300°–400°C. are preferred. When iron oxide films are deposited on low alkali-containing glass substrates, the preferred temperature of deposition is from about 360°–380°C. High alkali content glasses, such as soda lime glass, may require higher deposition temperatures, above about 480°C. Although the reasons for this higher temperature requirement are not completely understood, it is believed the presence of large amounts of cationic impurities, such as alkali metals, in the glass surface inhibits nucleation of the transition metal oxide crystallites. If the alkali metals are removed from the surface of the glass, deposition can proceed at lower temperatures and higher rates. When the temperature is too low, the rate of reaction between the organometallic compound and oxygen becomes too slow for an economic process. When the temperature is too high, the deposited films become too crystalline and grainy for use as photomasks for example. Harder films are obtained at higher temperatures.

The atmosphere in the reaction chamber must contain sufficient oxygen for reaction of the organometallic compound to form a metal oxide, to occur. The optimum amount of oxygen and the ratio of oxygen to inert gas for each system can be readily determined by one skilled in the art in a series of test runs.

Uniform, thin, semi-transparent films of transition metal oxides can be prepared by the above described process, which are strongly adherent to the substrate. Iron oxide coatings which are readily etchable using common etchants to form high definition patterns on the substrate can be prepared rapidly and inexpensively. The coatings are abrasion resistant to permit handling with ordinary care and to form photomasks having a long life.

The invention will be further illustrated by the following examples, but it is to be understood that the invention is not meant to be limited to the details described therein.

EXAMPLE 1

Part A

A series of 2 inch × 2 inch plates by Corning 7059 glass were coated with iron oxide in the apparatus of FIG. 1, except that the inlet tube for a separate oxygen-containing gas stream was closed off. A flow rate of 1,000 cc/min of oxygen was passed over dicyclopentadienyl iron. Both the carrier gas and the iron compound were heated at a temperature of 120°C., thus vaporizing the dicyclopentadienyl iron and admixing the vapor and the oxygen. This mixture was then passed into the reaction chamber containing the glass plates heated to 370°C. until a film of the desired thickness had been deposited. Semi-transparent, uniform, strongly adherent microcrystalline films of iron oxide on the glass were obtained.

Figure 2:
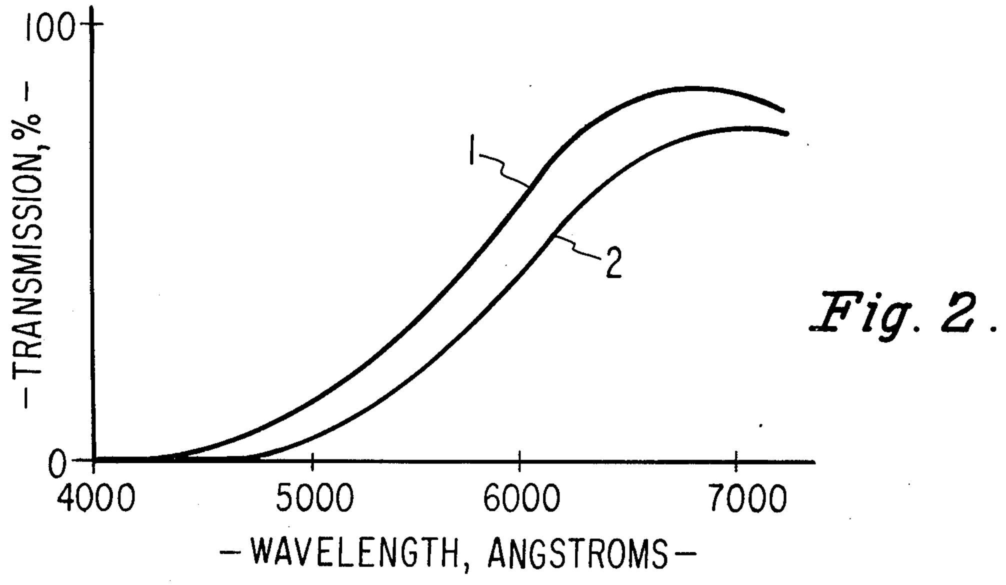
FIG. 2 is a graph of the spectral transmission of a transition metal oxide film on a glass substrate as a function of wavelength.

A graph of the optical transmission of two thicknesses of iron oxide as a function of wavelength is shown in FIG. 2. Curve 1 shows the optical transmission of an iron oxide coating 2,300 A thick and Curve 2 shows the optical transmission of an iron oxide coating 3,600 A thick.

Part B

Both plates were coated with a layer of Shipley AZ1350 photoresist, available commercially from the Shipley Company. The coated plates were exposed and developed in a manner conventional in fabricating photomasks. The resultant plates were then treated with 6 molar hydrochloric acid. The exposed iron oxide was etched rapidly to form a high definition pattern.

EXAMPLE 2

The procedure of Example 1, Part A was followed except that dicyclopentadienyl nickel was substituted for the dicyclopentadienyl iron and separate carrier gas and oxygen-containing gas streams were employed. The carrier gas was nitrogen fed at about 500 cc/min. and the reactant gas was oxygen fed at 500 cc/min.

Smooth layers of semi-amorphous nickel oxide were deposited on the glass substrates.

We claim:

1. A process for preparing a photomask which comprises a. vaporizing solvent-free dicyclopentadienyl iron at a temperature from about 100°–140°C., b. heating a transparent substrate to a temperature of about 300°–550°C., c. contacting the heated substrate with the vaporized dicyclopentadienyl iron in an oxygen-containing atmosphere so as to deposit a film of iron oxide on the substrate to a thickness of from about 500–5,000A, and d. forming a pattern in the iron oxide film by removing selected portions thereof.

2. A process according to claim 1 wherein the temperature of vaporization is from 110°–120°C.

3. A process according to claim 1 wherein the temperature of the substrate is from about 360°–380°C.

4. A process according to claim 1 wherein the deposition is continued until a film from about 1,700–2,500A thick has been deposited.

5. A photomask produced by the method of claim 1.

* * * * *